(12) United States Patent
Huang et al.

(10) Patent No.: US 8,704,272 B2
(45) Date of Patent: Apr. 22, 2014

(54) AVALANCHE PHOTODIODE WITH SPECIAL LATERAL DOPING CONCENTRATION

(75) Inventors: Mengyuan Huang, Beijing (CN); Pengfei Cai, Beijing (CN); Dong Pan, Andover, MA (US)

(73) Assignee: SiFotonics Technologies Co, Ltd., Woburn, MA (US)

( * ) Notice: Subject to any disclaimer, the term of this patent is extended or adjusted under 35 U.S.C. 154(b) by 259 days.

(21) Appl. No.: 13/280,649

(22) Filed: Oct. 25, 2011

(65) Prior Publication Data

US 2012/0326259 A1 Dec. 27, 2012

Related U.S. Application Data

(60) Provisional application No. 61/571,279, filed on Jun. 24, 2011.

(51) Int. Cl.
*H01L 31/107* (2006.01)
(52) U.S. Cl.
USPC .......................................... 257/186; 257/438
(58) Field of Classification Search
USPC ................................ 257/186, 438
See application file for complete search history.

(56) References Cited

U.S. PATENT DOCUMENTS

| 6,515,315 | B1 * | 2/2003 | Itzler et al. | 257/186 |
| 6,743,657 | B2 * | 6/2004 | Dries et al. | 438/91 |
| 2009/0020782 | A1 * | 1/2009 | Pan et al. | 257/185 |
| 2009/0242933 | A1 * | 10/2009 | Hu et al. | 257/186 |

* cited by examiner

*Primary Examiner* — Douglas Menz
(74) *Attorney, Agent, or Firm* — Han IP Corporation

(57) ABSTRACT

Avalanche photodiodes having special lateral doping concentration that reduces dark current without causing any loss of optical signals and method for the fabrication thereof are described. In one aspect, an avalanche photodiode comprises: a substrate, a first contact layer coupled to at least one metal contract of a first electrical polarity, an absorption layer, a doped electric control layer having a central region and a circumferential region surrounding the central region, a multiplication layer having a partially doped central region, and a second contract layer coupled to at least one metal contract of a second electrical polarity. Doping concentration in the central section is lower than that of the circumferential region. The absorption layer can be formed by selective epitaxial growth.

15 Claims, 4 Drawing Sheets

AVALANCHE PHOTODIODE WITH SPECIAL LATERAL DOPING CONCENTRATION

CROSS-REFERENCE TO RELATED PATENT APPLICATIONS

This application claims priority to U.S. Patent Application Ser. No. 61/571,279, entitled "Ge/Si Avalanche Photodiode with an Undepleted Absorber for High Speed Optical Communication", filed on Jun. 24, 2011, which is herein incorporated in its entirety by reference.

BACKGROUND

1. Technical Field

The present disclosure relates to photosensitive devices. More particularly, the present disclosure relates to an avalanche photodiode.

2. Description of Related Art

An avalanche photodiode (APD) is a type of photosensitive semiconductor device in which light is converted to electricity due to the photoelectric effect coupled with electric current multiplication as a result of avalanche breakdown. APDs differ from conventional photodiodes in that incoming photons internally trigger a charge avalanche in APDs. Avalanche photodiodes are typically employed in laser rangefinder applications and long-range fiber optic telecommunication applications.

One of the parameters that impact the applicability and usefulness of APDs is dark current, which is a type of relatively small electric current that flows through a photosensitive device, such as a photodiode, even when no photons are entering the photosensitive device. Dark current is one of the main sources of noise in photosensitive devices. Consequently, dark current is a limiting factor for Ge/Si APDs in high-speed optical communication applications.

There is, therefore, a need for a novel and non-obvious design of APDs that reduces the effect of dark current to achieve high performance.

SUMMARY

The present disclosure provides APDs having special lateral doping concentration that reduces the dark current without causing any loss of optical signals to achieve high device performance and methods of their fabrication.

In one aspect, an avalanche photodiode may comprise a substrate and a multi-layer structure disposed on the substrate. The multi-layer structure may comprise: a first contact layer coupled to at least one metal contact of a first electrical polarity; an absorption layer on which the first contact layer is disposed, the absorption layer absorbing photons of an optical beam incident on the multi-layer structure; an electric field control layer on which the absorption layer is disposed; a multiplication layer on which the electric field control layer is disposed, the multiplication layer configured such that an avalanche breakdown occurs in the multiplication layer in response to the absorption layer absorbing the photons of the optical beam; and a second contact layer on which the multiplication layer is disposed, the second contact layer coupled to at least one metal contact of a second electrical polarity. The absorption layer may be made of a first material. The electric field control layer may be made of a second material and aids distribution of an electric field inside the multiplication layer. A central region of the electric field control layer may be doped with a first type of dopant at a first level of concentration and a circumferential region of the electric field control layer surrounding the central region is doped with the first type of dopant at a second level of concentration higher than the first level.

In some embodiments, a portion of the central region of the multiplication layer may be doped with a second type of dopant. The second type of dopant may be arsenic, phosphorous, or other n-type dopants for Si.

In some embodiments, one or more of a size, a doping concentration, and a thickness of the central region of the multiplication layer may be controlled so that an electric field in the central region is higher than that of regions of the multiplication layer that surround the central region.

In some embodiments, one or more of a size, a doping concentration, and a thickness of the central region of the electric field control layer may be controlled so that electric field entering into the absorption layer above the circumferential region of the electric field control field is minimized.

In some embodiments, the absorption layer may be made of Ge or other III-IV materials including InGaAsP and InGaAs.

In some embodiments, the electric field control layer may be made of Si, SiGeC or other Si alloys.

In some embodiments, the first type of dopant may be boron, $BF_2$ or other p-type dopants for Si.

In some embodiments, the multiplication layer may be made of Si.

In some embodiments, the substrate may comprise a Si substrate or a silicon-on-insulator (SOI) substrate.

In another aspect, a method of making an avalanche photodiode, may comprise: forming a second contact layer on a substrate, the second contact layer coupled to at least one metal contact of a second electrical polarity; forming a multiplication layer on the second contact layer; forming an electric field control layer on the multiplication layer, the electric field control layer doped with a first type of dopant; forming an absorption layer on the electric field control layer; and forming a first contact layer on the absorption layer, the first contact layer coupled to at least one metal contact of a first electrical polarity.

In some embodiments, the method may further comprise doping a portion of a central region of the multiplication layer with a second type of dopant.

In some embodiments, the absorption layer may be formed by selective epitaxial growth.

In some embodiments, the selective epitaxial growth may comprise causing the selective epitaxial growth by using molecular beam epitaxy, chemical vapor deposition, or vapor phase epitaxy.

In yet another aspect, an avalanche photodiode may comprise a substrate and a multi-layer structure disposed on the substrate. The multi-layer structure may comprise: a first contact layer coupled to at least one metal contact of a first electrical polarity; an absorption layer on which the first contact layer is disposed, the absorption layer absorbing photons of an optical beam incident on the multi-layer structure; an electric field control layer on which the absorption layer is disposed; a multiplication layer on which the electric field control layer is disposed, the multiplication layer configured such that an avalanche breakdown occurs in the multiplication layer in response to the absorption layer absorbing the photons of the optical beam; and a second contact layer on which the multiplication layer is disposed, the second contact layer coupled to at least one metal contact of a second electrical polarity. The absorption layer may be made of a first material. The electric field control layer may be made of a second material and aids distribution of an electric field inside the multiplication layer. A central region of the electric field control layer may be doped with a first type of dopant at a first level of concentration and a circumferential region of the electric field control layer surrounding the central region is doped with the first type of dopant at a second level of concentration higher than the first level. A portion of a central region of the multiplication layer may be doped with a second type of dopant.

In some embodiments, one or more of a size, a doping concentration, and a thickness of the central region of the electric field control layer may be controlled so that electric field entering into the absorption layer above the circumferential region of the electric field control field is minimized.

In some embodiments, one or more of a size, a doping concentration, and a thickness of the central region of the multiplication layer may be controlled so that an electric field in the central region is higher than that of regions of the multiplication layer that surround the central region.

In some embodiments, the second type of dopant may be arsenic, phosphorous, or other n-type dopants for Si.

In some embodiments, the absorption layer may be made of Ge or other III-IV materials including InGaAsP and InGaAs.

In some embodiments, the electric field control layer may be made of Si, SiGeC or other Si alloys.

In some embodiments, the first type of dopant may be boron, $BF_2$ or other p-type dopants for Si.

In some embodiments, the multiplication layer may be made of Si.

In some embodiments, the substrate may comprise a Si substrate or a silicon-on-insulator (SOI) substrate.

These and other features, aspects, and advantages of the present disclosure will be explained below with reference to the following figures. It is to be understood that both the foregoing general description and the following detailed description are by examples, and are intended to provide further explanation of the present disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Overview

Figure 1:
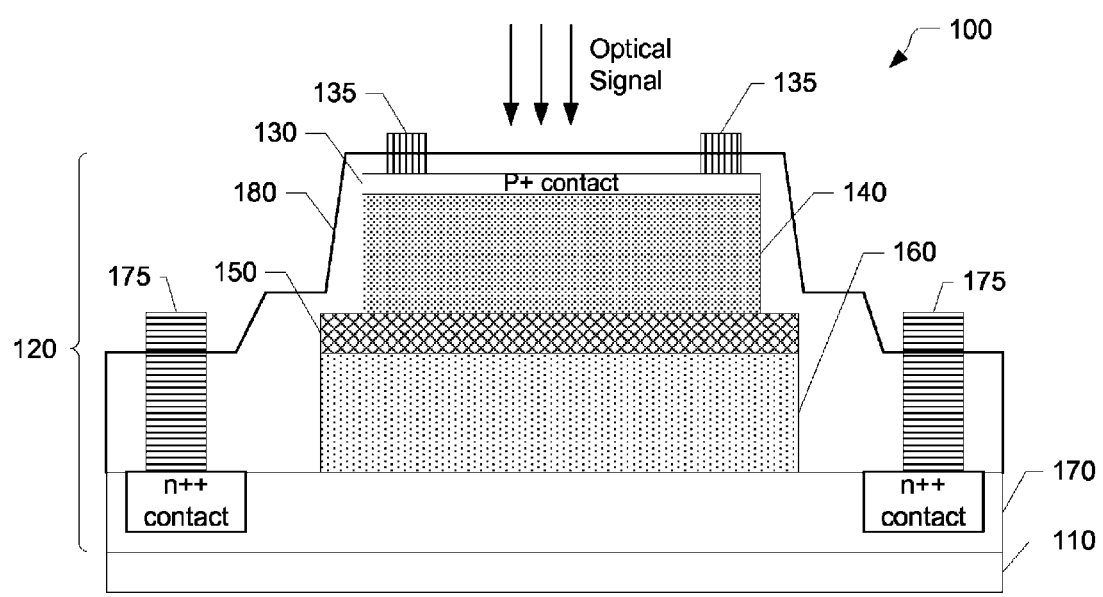
FIG. 1 is a cross-sectional view of a conventional APD.

The present disclosure provides APDs having lateral doping concentration that reduces the effect of dark current without causing any loss of optical signals to achieve high device performance and method for their fabrication. FIGS. 1-3 are not drawn to scale and are provided to convey the concept of the various embodiments of the present disclosure.

Exemplary Embodiments

FIG. 1 is a cross-sectional view of a conventional APD. Referring to FIG. 1, a typical APD 100 has a substrate 110 made of silicon (Si) and a multi-layer structure 120 disposed on the substrate 110. The multi-layer structure 120 includes a first-type contact layer 130 coupled to at least one first-type metal contact 135, an absorption layer 140 made of germanium (Ge) on which the first-type contract layer 130 is disposed, an electric field control layer 150 made of first-type Si on which the absorption layer 140 is disposed, a multiplication layer 160 made of Si on which the electric field control layer 150 is disposed, and a second-type contact layer 170 made of second-type Si on which the multiplication layer 160 is disposed. The APD 100 has at least one second-type metal contact 175 coupled to the n-type contact layer 170. The APD 100 further has an anti-reflection coating 180 that covers the multi-layer structure 120.

Representative APDs of the present disclosure are schematically shown in cross-sectional views in FIGS. 2A, 2B, 3A and 3B.

Figure 2A:
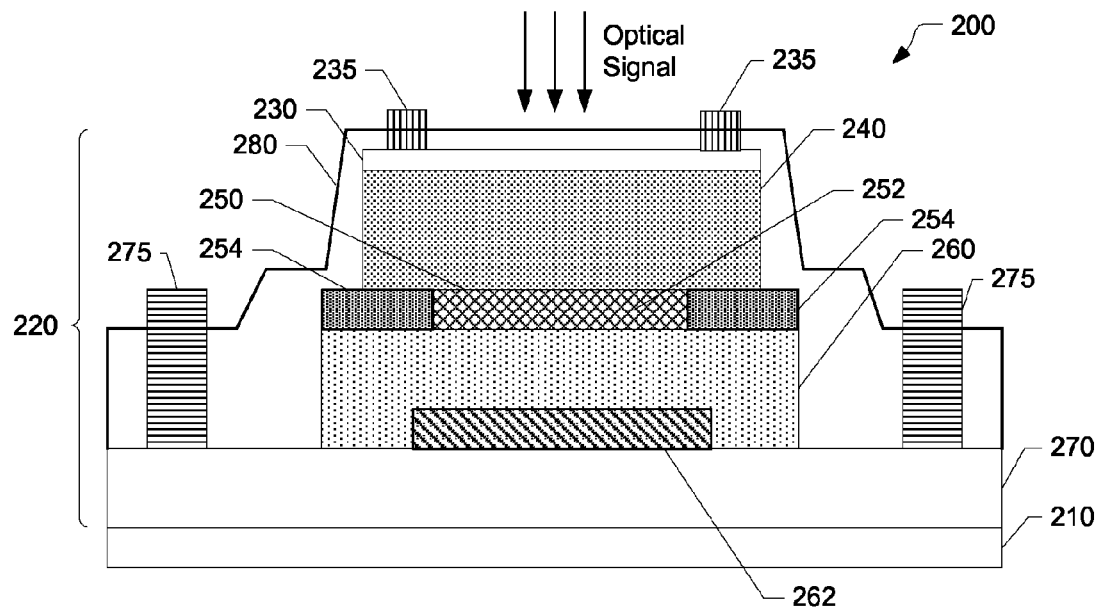
FIG. 2A is a cross-sectional view of an APD in accordance with some embodiments of the present disclosure.

FIG. 2A is a cross-sectional view of an APD 200 in accordance with an embodiment of the present disclosure. Referring to FIG. 2, the APD 200 may comprise a substrate 210 and a multi-layer structure 220 disposed on the substrate 210. The multi-layer structure 220 may comprise: a first-type contact layer 230 coupled to at least one first-type metal contact 235, an absorption layer 240 made of Ge on which the first-type contract layer 230 is disposed, an electric field control layer 250 made of first-type Si on which the absorption layer 240 is disposed, a multiplication layer 260 made of Si on which the electric field control layer 250 is disposed, and a second-type contact layer 270 made of second-type Si on which the multiplication layer 260 is disposed. At least one second-type metal contact 275 is coupled to the contact layer 270. The APD 200 may further comprise an anti-reflection coating 280 that covers the multi-layer structure 220.

In some embodiments, a central region 252 of the electric field control layer 250 is doped with a first type of dopant at a first level of concentration, and a circumferential region 254 of the electric field control layer 250 surrounding, or encircling, the central region 252 is doped with the first type of dopant at a second level of concentration that is higher than the first level of concentration. In other words, the circumferential region 254 may be seen as a "guard ring" encircling the central region 252 and having a higher concentration of the first type of dopant than that of the central region 252. The first type of dopant may be, for example, boron, BF2 or other p-type dopants for Si.

In some embodiments, a central region 262 of the multiplication layer 260 is doped with a second type of dopant. The second type of dopant may be, for example, arsenic, phosphorous, or other n-type dopants for Si.

In some embodiments, the absorption layer 240 comprise Ge or other III-IV materials, such as InGaAsP or InGaAs, which have a large lattice mismatch with the substrate 210.

In some embodiments, one or more factors, such as the size, doping concentration and thickness of the guard ring, or the circumferential region 254 of the electric field control layer 250, are controlled to prevent or minimize charge carriers, or electric field, from moving into the absorption layer 240.

In some embodiments, one or more factors, such as the size, doping concentration and thickness of the partially doped region, or the central region 262, of multiplication layer 260 are controlled so that the electric field in the central region 262 is higher than the electric field in other regions of the multiplication layer 260, such as those regions of the multiplication layer 260 that surround the central region 262. Since the central region 262 of the multiplication layer 260 is the main path of photo-generated carriers, it is necessary to maintain a high electric field in the central region 262 for the avalanche process to occur. This design keeps the electric field low in regions of the multiplication layer 260 that surround the central region 262 to avoid excessive noise during the avalanche process.

In some embodiments, the substrate 210 is a Si substrate or a silicon-on-insulator (SOI) substrate.

Figure 2B:
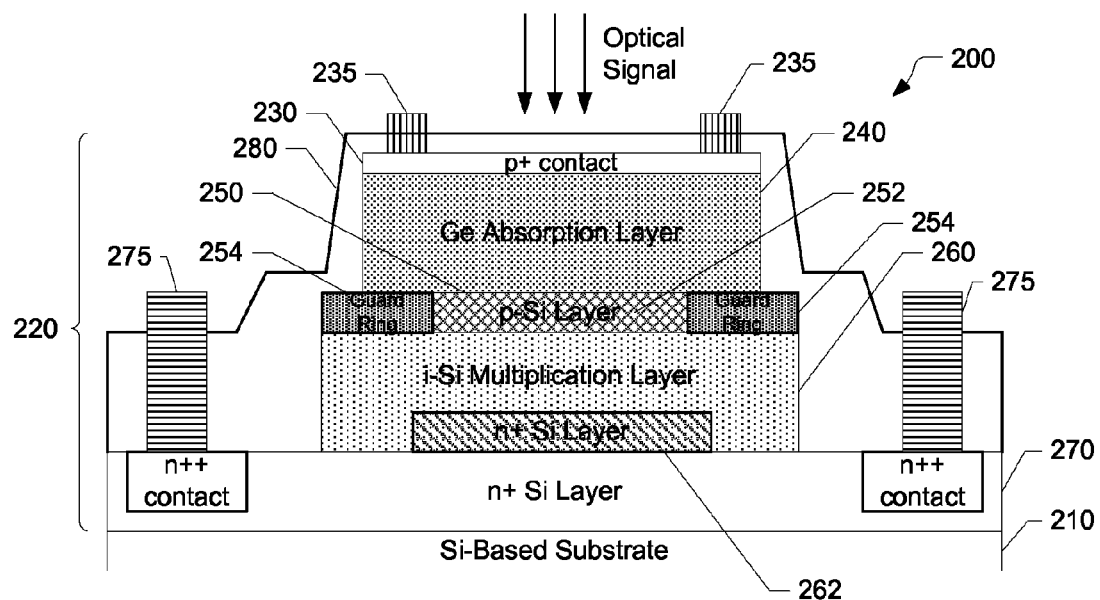
FIG. 2B is a cross-sectional view of an APD in accordance with an exemplary embodiment of the present disclosure.

FIG. 2B illustrates an exemplary embodiment of the APD 200. In this embodiment, the substrate 210 is a silicon-based substrate, the first-type contact layer 230 is a p-type contact layer coupled to at least one p-type metal contact 235, the absorption layer 240 is a blanket Ge absorption layer, the electric field control layer 250 is a p-type Si layer, the multiplication layer 260 is a Si multiplication layer, and the second-type contact layer 270 is an n-type Si layer coupled to at least one n-type metal contact 275.

Figure 3A:
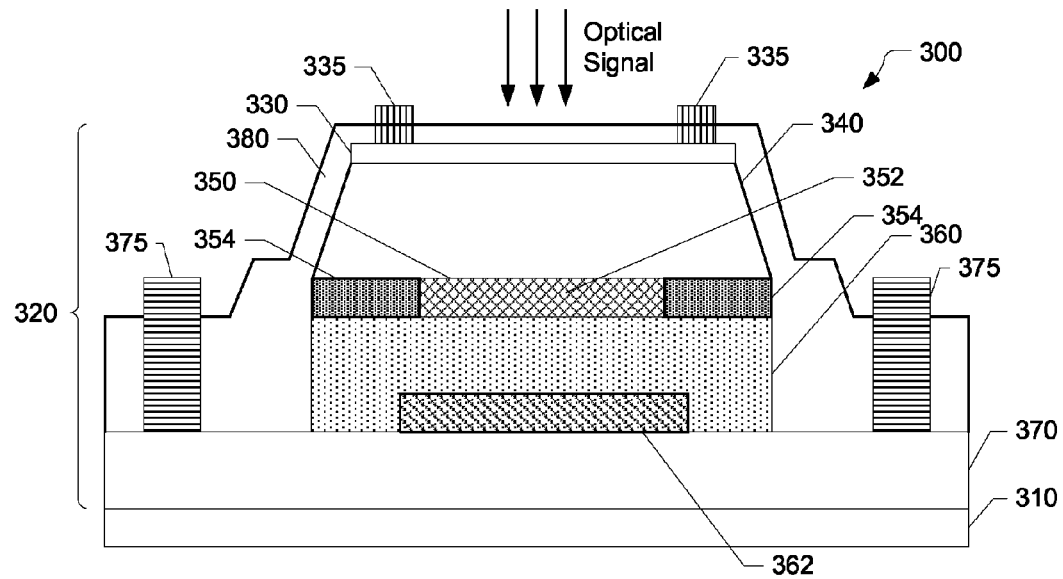
FIG. 3A is a cross-sectional view of an APD in accordance with some embodiments of the present disclosure.

FIG. 3A is a cross-sectional view of an APD 300 in accordance with an embodiment of the present disclosure. Referring to FIG. 3, the APD 300 may comprise a substrate 310 and a multi-layer structure 320 disposed on the substrate 310. The multi-layer structure 320 may comprise: a first-type contact layer 330 coupled to at least one first-type metal contact 335, an absorption layer 340 made of Ge on which the first-type contract layer 330 is disposed, an electric field control layer 350 made of first-type Si on which the absorption layer 340 is disposed, a multiplication layer 360 made of Si on which the electric field control layer 350 is disposed, and a second-type contact layer 370 made of second-type Si on which the multiplication layer 360 is disposed. At least one second-type metal contact 375 is coupled to the contact layer 370. The APD 300 may further comprise an anti-reflection coating 380 that covers the multi-layer structure 320.

The basic structure of the APD 300 is similar to that of APD 200 except that the absorption layer 340 is disposed on the electric field control layer 350 by selective epitaxial growth (SEG) which may comprise, for example, causing the selective epitaxial growth by using molecular beam epitaxy, chemical vapor deposition, or vapor phase epitaxy.

In some embodiments, a central region 352 of the electric field control layer 350 is doped with a first type of dopant at a first level of concentration, and a circumferential region 354 of the electric field control layer 350 surrounding, or encircling, the central region 352 is doped with the first type of dopant at a second level of concentration that is higher than the first level of concentration. In other words, the circumferential region 354 may be seen as a "guard ring" encircling the central region 352 and having a higher concentration of the first type of dopant than that of the central region 352. The first type of dopant may be, for example, boron, $BF_2$ or other p-type dopants for Si.

In some embodiments, a central region 362 of the multiplication layer 360 is doped with a second type of dopant. The second type of dopant may be, for example, arsenic, phosphorous, or other n-type dopants for Si.

In some embodiments, the absorption layer 340 comprise Ge or other III-IV materials, such as InGaAsP or InGaAs, which have a large lattice mismatch with the substrate 310.

In some embodiments, one or more factors, such as the size, doping concentration and thickness of the guard ring, or the circumferential region 354 of the electric field control layer 350, are controlled to prevent or minimize charge carriers, or electric field, from moving into the absorption layer 340.

In some embodiments, one or more factors, such as the size, doping concentration and thickness of the partially doped region, or the central region 362, of multiplication layer 360 are controlled so that the electric field in the central region 362 is higher than the electric field in other regions of the multiplication layer 360, such as those regions of the multiplication layer 360 that surround the central region 362.

In some embodiments, the substrate 310 is a Si substrate or an SOI substrate.

Figure 3B:
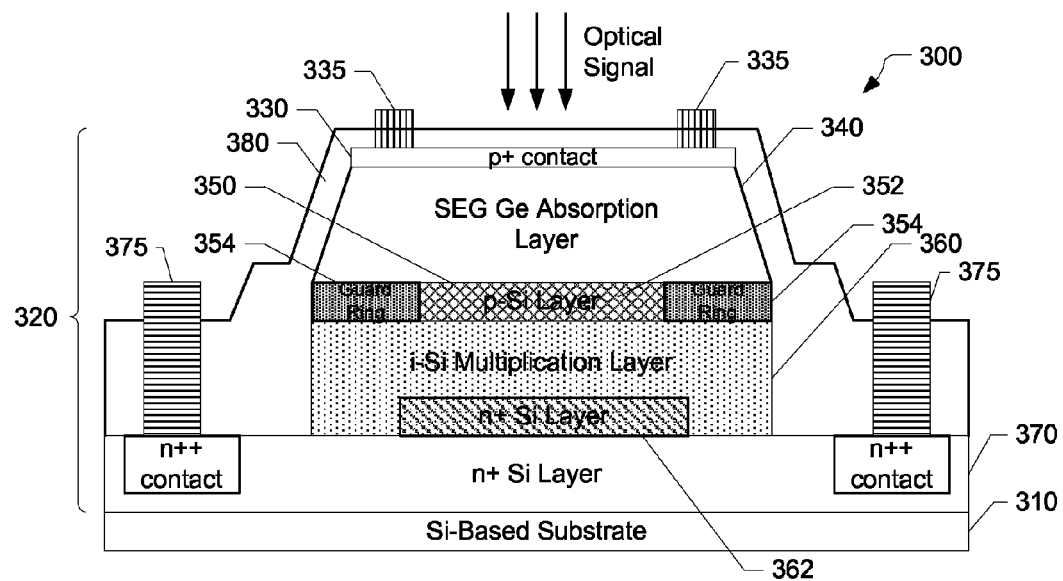
FIG. 3B is a cross-sectional view of an APD in accordance with an exemplary embodiment of the present disclosure.

FIG. 3B illustrates an exemplary embodiment of the APD 300. In this embodiment, the substrate 310 is a silicon-based substrate, the first-type contact layer 330 is a p-type contact layer coupled to at least one p-type metal contact 335, the absorption layer 340 is an SEG Ge absorption layer, the electric field control layer 350 is a p-type Si layer, the multiplication layer 360 is a Si multiplication layer, and the second-type contact layer 370 is an n-type Si layer coupled to at least one n-type metal contact 375.

Exemplary Test Results

The higher doping concentration in the central region 262, 362 of the multiplication layer 260, 360 can be achieved by: (i) depositing a thin layer (<200 nm) of Si on wafers (thinner than the multiplication layer 260, 360), and implanting with masks to result in the higher concentration in the central region 260, 360, and then depositing Si to reach the thickness of the multiplication layer 260, 360; or (ii) directly implanting (with masks) on wafers to make a higher concentration in the central region of the wafer surface, and depositing Si layer to form the multiplication layer 260, 360. The formation of the guard ring, or circumferential region 254, 354 in the electric field control layer 250, 350 can be achieved by two rounds of implantations. The first implantation is to form the electric filed control layer 250, 350 using a conventional method. The second implantation (with masks) is to increase the doping concentration at certain regions, namely the guard ring, or circumferential region 254, 354.

Figure 4:
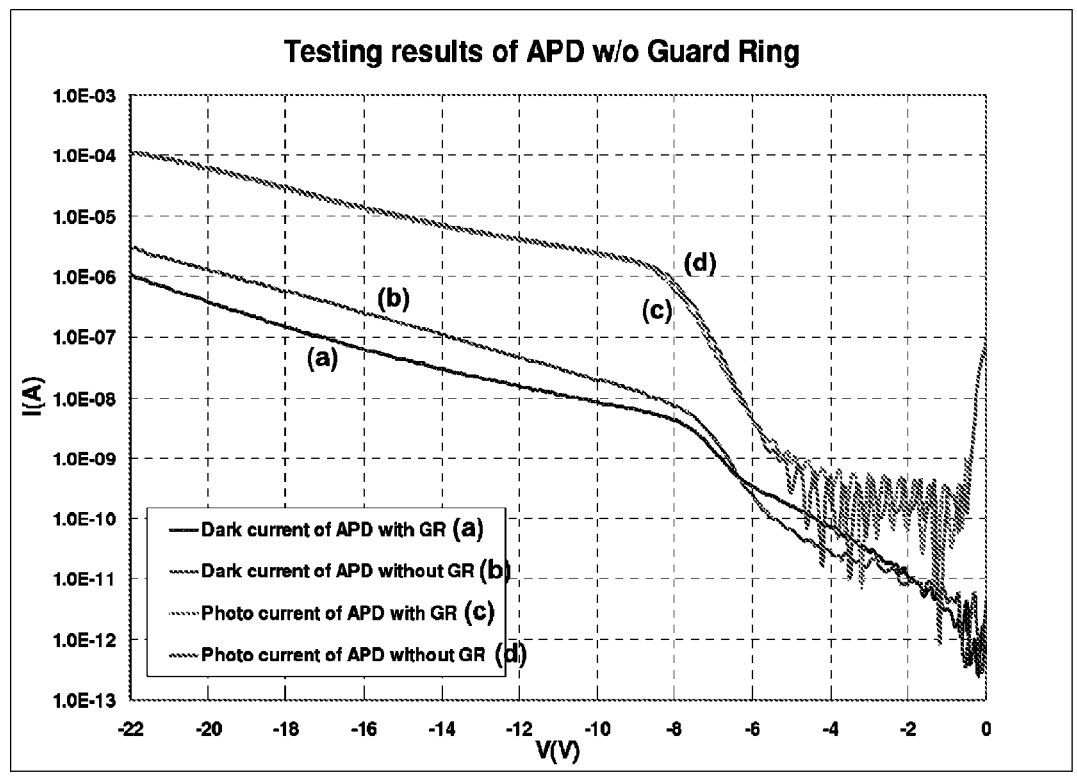
FIG. 4 is a chart showing test results of a conventional APD and an APD in accordance with the present disclosure.

FIG. 4 is a chart showing test results of a conventional APD and an APD in accordance with the present disclosure, such as the APD 200 of FIG. 2 or the APD 300 of FIG. 3. The vertical axis represents current in units of ampere and the horizontal axis represents voltage in units of voltage. Curve (a) in FIG. 4 is the dark current of an APD in accordance with the present disclosure. Curve (b) in FIG. 4 is the dark currant of a conventional APD. Curve (c) in FIG. 4 is the photo current of an APD in accordance with the present disclosure. Curve (d) in FIG. 4 is the photo current of a conventional APD. FIG. 4 demonstrates that the presence of a guard ring, such as the central region 252 of the electric field control layer 250 in the APD 200 or the central region 252 of the electric field control layer 250 in the APD 300, can effectively decrease device dark current. Meanwhile, it does not cause any loss of optical signals. As a result, device performance is greatly improved.

Conclusion

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. An avalanche photodiode, comprising:
a substrate; and
a multi-layer structure disposed on the substrate, the multi-layer structure comprising:
a first contact layer coupled to at least one metal contact of a first electrical polarity;
an absorption layer on which the first contact layer is disposed, the absorption layer absorbing photons of an optical beam incident on the multi-layer structure;
an electric field control layer on which the absorption layer is disposed;
a multiplication layer on which the electric field control layer is disposed, the multiplication layer configured such that an avalanche breakdown occurs in the multiplication layer in response to the absorption layer absorbing the photons of the optical beam; and
a second contact layer on which the multiplication layer is disposed, the second contact layer coupled to at least one metal contact of a second electrical polarity, wherein:
the absorption layer is made of a first material;
the electric field control layer is made of a second material and aids distribution of an electric field inside the multiplication layer;
a central region of the electric field control layer is doped with a first type of dopant at a first level of concentration and a circumferential region of the electric field control layer surrounding the central region is doped with the first type of dopant at a second level of concentration higher than the first level; and
wherein a portion of the central region of the multiplication layer is doped with a second type of dopant, and wherein one or more of a size, a doping concentration, and a thickness of the central region of the multiplication layer are controlled so that an electric field in the central region is higher than that of regions of the multiplication layer that surround the central region.

2. The avalanche photodiode of claim 1, wherein one or more of a size, a doping concentration, and a thickness of the central region of the electric field control layer may be controlled so that electric field entering into the absorption layer above the circumferential region of the electric field control field is minimized.

3. The avalanche photodiode of claim 1, wherein the first type of dopant comprises boron, $BF_2$ or other p-type dopants for Si, and wherein the second type of dopant comprises arsenic, phosphorous, or other n-type dopants for Si.

4. The avalanche photodiode of claim 1, wherein the absorption layer is made of Ge or other III-IV materials including InGaAsP and InGaAs.

5. The avalanche photodiode of claim 1, wherein the electric field control layer is made of Si, SiGeC or other Si alloys.

6. The avalanche photodiode of claim 1, wherein the multiplication layer is made of Si.

7. The avalanche photodiode of claim 1, wherein the substrate comprises a Si substrate or a silicon-on-insulator (SOI) substrate.

8. An avalanche photodiode, comprising:
a substrate;
a multi-layer structure disposed on the substrate, the multi-layer structure comprising:
a first contact layer coupled to at least one metal contact of a first electrical polarity;
an absorption layer on which the first contact layer is disposed, the absorption layer absorbing photons of an optical beam incident on the multi-layer structure;
an electric field control layer on which the absorption layer is disposed;
a multiplication layer on which the electric field control layer is disposed, the multiplication layer configured such that an avalanche breakdown occurs in the multiplication layer in response to the absorption layer absorbing the photons of the optical beam; and
a second contact layer on which the multiplication layer is disposed, the second contact layer coupled to at least one metal contact of a second electrical polarity, wherein:
the absorption layer is made of a first material;
the electric field control layer is made of a second material and aids distribution of an electric field inside the multiplication layer;
a central region of the electric field control layer is doped with a first type of dopant at a first level of concentration and a circumferential region of the electric field control layer surrounding the central region is doped with the first type of dopant at a second level of concentration higher than the first level; and
a portion of a central region of the multiplication layer is doped with a second type of dopant.

9. The avalanche photodiode of claim 8, wherein one or more of a size, a doping concentration, and a thickness of the central region of the multiplication layer are controlled so that an electric field in the central region is higher than that of regions of the multiplication layer that surround the central region.

10. The avalanche photodiode of claim 8, wherein the first type of dopant comprises boron, BF2 or other p-type dopants for Si, and wherein the second type of dopant is arsenic, phosphorous, or other n-type dopants for Si.

11. The avalanche photodiode of claim 8, wherein one or more of a size, a doping concentration, and a thickness of the central region of the electric field control layer may be controlled so that electric field entering into the absorption layer above the circumferential region of the electric field control field is minimized.

12. The avalanche photodiode of claim 8, wherein the absorption layer is made of Ge or other III-IV materials including InGaAsP and InGaAs.

13. The avalanche photodiode of claim 8, wherein the electric field control layer is made of Si, SiGeC or other Si alloys.

14. The avalanche photodiode of claim 8, wherein the multiplication layer is made of Si.

15. The avalanche photodiode if claim, 8, wherein the substrate comprises a Si substrate or a silicon-on-insulator (SOI) substrate.

* * * * *